United States Patent
Ozdemir et al.

(10) Patent No.: US 6,775,084 B1
(45) Date of Patent: Aug. 10, 2004

(54) CIRCUIT AND METHOD FOR DETERMINING THE PHASE DIFFERENCE BETWEEN A SAMPLE CLOCK AND A SAMPLED SIGNAL

(75) Inventors: Hakan Ozdemir, San Jose, CA (US); Jason D. Byrne, Longmont, CO (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/503,453

(22) Filed: Feb. 14, 2000

(51) Int. Cl.[7] .................................. G11B 5/02
(52) U.S. Cl. ........................... 360/55; 360/51
(58) Field of Search ................ 341/111; 360/26; 375/326, 55

(56) References Cited

U.S. PATENT DOCUMENTS

| | | | |
|---|---|---|---|
| 3,956,623 A | * | 5/1976 | Clark et al. .................. 375/328 |
| 4,412,339 A | | 10/1983 | Alfke et al. |
| 4,563,637 A | * | 1/1986 | De Bortoli et al. ......... 375/371 |
| 5,056,116 A | | 10/1991 | Shimada et al. |
| 5,359,631 A | | 10/1994 | Behrens et al. |
| 5,486,867 A | | 1/1996 | Hsu et al. |
| 5,727,027 A | * | 3/1998 | Tsuda ......................... 375/329 |
| 5,835,295 A | * | 11/1998 | Behrens ....................... 360/51 |
| 5,848,099 A | | 12/1998 | Benner |
| 6,307,696 B1 | * | 10/2001 | Bishop et al. ................ 360/51 |
| 6,493,403 B1 | * | 12/2002 | Ashley et al. .............. 375/326 |

FOREIGN PATENT DOCUMENTS

WO  WO 99/39346  8/1999

OTHER PUBLICATIONS

European Search Report for EP 01 30 0785 dated Sep. 23, 2003.

* cited by examiner

*Primary Examiner*—David Hudspeth
*Assistant Examiner*—Rocio Colon
(74) *Attorney, Agent, or Firm*—Lisa K. Jorgenson; Bryan A. Santarelli (57) ABSTRACT

A circuit includes a buffer for receiving and storing two samples of a signal, and a phase calculation circuit for calculating from the samples a phase difference between one of the samples and a predetermined point of the signal. Such a circuit can be used to decrease the alignment-acquisition time of a digital timing-recovery loop, and thus allows a shortening of the sector preambles and a corresponding increase in the data-storage density of a disk. In one application, the circuit determines an initial phase difference between a disk-drive read signal and a read-signal sample clock. The digital timing-recovery loop uses this phase difference to provide an initial coarse alignment between the read signal and the sample clock. By providing an initial coarse alignment, the recovery loop reduces the overall alignment-acquisition time.

31 Claims, 9 Drawing Sheets

CIRCUIT AND METHOD FOR DETERMINING THE PHASE DIFFERENCE BETWEEN A SAMPLE CLOCK AND A SAMPLED SIGNAL

CROSS-REFERENCE TO RELATED APPLICATION

This application is related to U.S. Patent App. entitled CIRCUIT AND METHOD FOR DETERMINING THE PHASE DIFFERENCE BETWEEN A SAMPLE CLOCK AND A SAMPLED SIGNAL BY LINEAR APPROXIMATION, U.S. patent application Ser. No. 09/503,929, which was filed on the same day as the present application and which is incorporated by reference.

TECHNICAL FIELD OF THE INVENTION

The invention relates generally to electronic circuits, and more particularly to a circuit and method for providing an initial phase difference between a disk-drive read signal and a read-signal sample clock. A digital timing-recovery circuit can use this phase difference to provide an initial coarse alignment between the read signal and the sample clock. By providing an initial coarse alignment, the recovery circuit can reduce the overall alignment-acquisition time.

BACKGROUND OF THE INVENTION

Switching and other types of noise can cause today's high-speed integrated circuits (ICs) to operate improperly. One solution is to electrically isolate a noise-susceptible circuit from a noisy circuit using a ground plane, shielding, or other isolation techniques. Another solution is modify the noisy circuit so that it generates less noise.

In addition, to placate computer users who are demanding faster data-processing and data-transfer rates, IC manufacturers wish to design faster digital ICs that support these faster rates. Typically, one increases data-processing and transfer rates by increasing the clock speed of the ICs that perform these tasks. Unfortunately, merely increasing an IC's clock frequency without redesigning it may cause circuits on the IC to oscillate.

Figure 1:
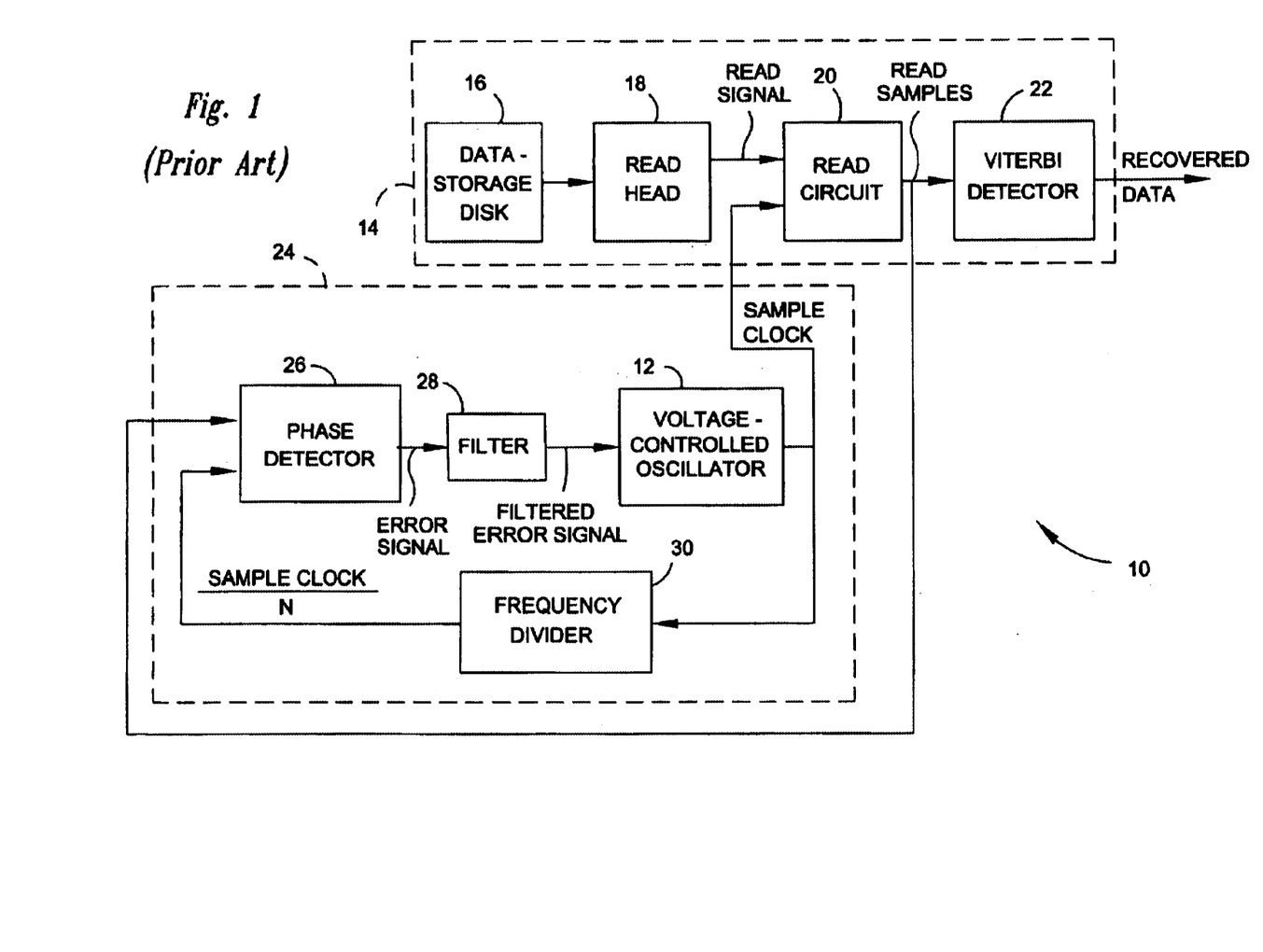
FIG. 1 is a block diagram of a conventional disk-drive read channel.

FIG. 1 is a block diagram of a conventional disk-drive read channel 10 having a voltage-controlled oscillator (VCO) 12, which may inject noise or transients into other circuits within the read channel 10 or elsewhere. The read channel 10 includes a read path 14, which includes a disk 16 for storing data, a read head 18 for reading the disk 16 and for generating a read signal that represents the read data, a read circuit 20 for sampling the read signal in response to a sample clock, and a Viterbi detector 22 for recovering the stored data from the samples of the read signal. The read channel 10 also includes a phase-locked timing loop 24 for generating the sample clock, for aligning the sample clock with the read signal such that the read circuit 20 samples the read signal at appropriate times, and for maintaining the alignment of the sample clock. The timing loop 24 includes a phase detector 26 for generating an error signal that represents the phase difference between the read signal and the sample clock, a filter 28 for filtering the error signal, the VCO 12 for generating the sample clock at a frequency indicated by the filtered error signal, and a frequency divider 30 for allowing the frequency of the sample clock to be greater than the data rate of the read signal. The read circuit 20 effectively closes the loop 24, i.e., couples the loop input to the loop output.

Figure 2:
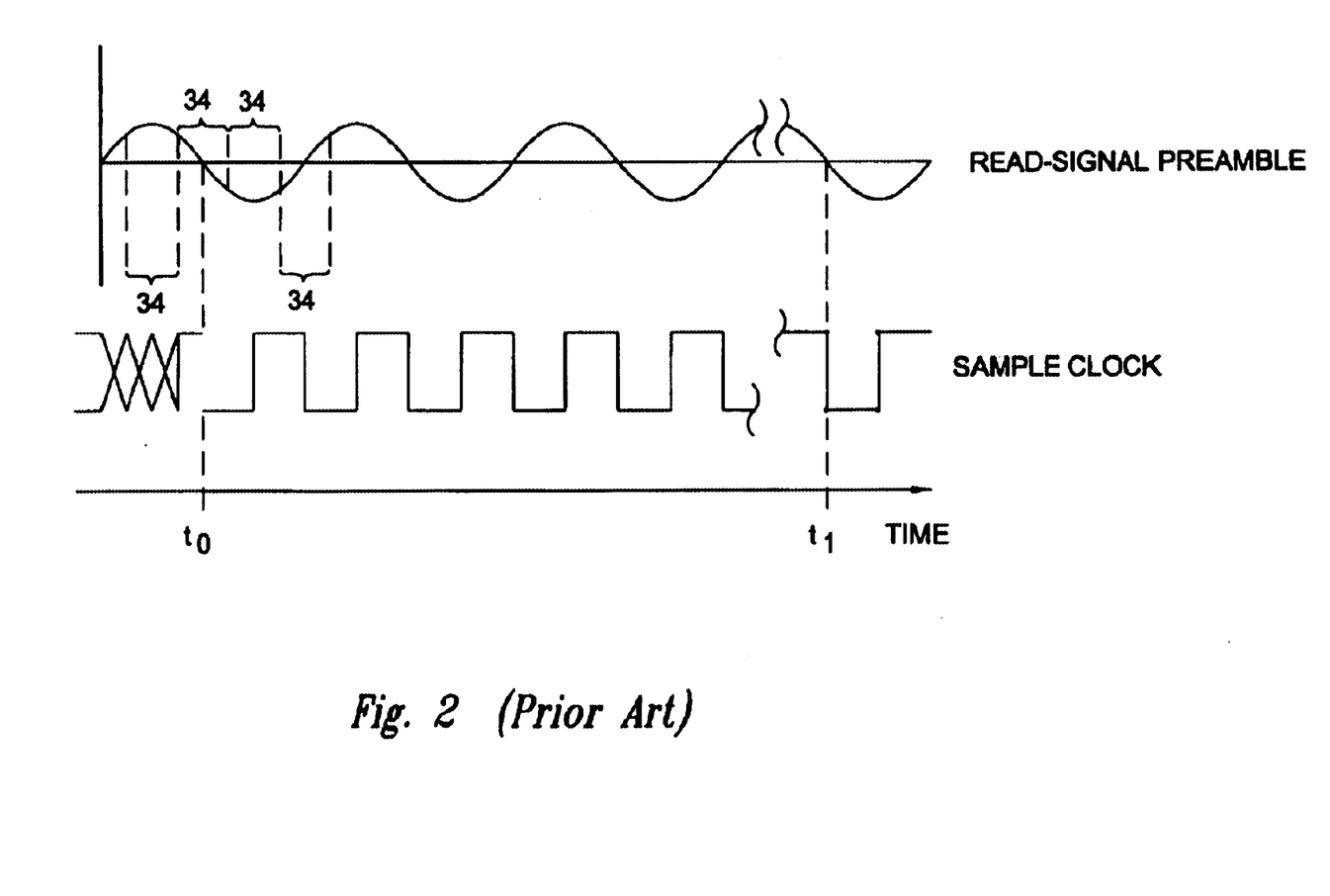
FIG. 2 is a timing diagram of signals from FIG. 1.

FIG. 2 is a timing diagram showing the desired alignment between the sample clock and the preamble portion of the read signal. Referring to FIGS. 1 and 2, the preamble is a bit pattern stored at the beginning of every sector (individual sectors not shown) of the disk 16. The read channel 10 uses the preamble to calibrate the channel timing with respect to the read signal. While reading the preamble, the read head 18 generates a sinusoid (or an approximate sinusoid). The peaks and zero crossings of this preamble sinusoid correspond to the centers of respective data windows 34. During the subsequent data portion (not shown) of the read signal, the centers of the data windows 34 correspond to the data points of the read signal—the data points are the portions of the read signal that the head 18 generates while positioned directly over the respective storage locations on the surface of the disk 16. By aligning the sampling edges of the sampling clock with the peaks and zero crossings of the preamble sinusoid, these edges will be aligned with the centers of the data windows 34 during the data portion of the read signal, and thus will cause the read circuit 20 to sample the read signal at the data points.

Referring to FIGS. 1 and 2, the timing loop 24 aligns the sample clock with the read signal during the preamble portion and maintains this alignment during the data portion of the read signal. In response to the zero crossing of the preamble sinusoid at time $t_0$, a start-up circuit (not shown) causes the VCO to generate a predetermined edge of the sample clock—a falling edge in this example—and thus provides a coarse alignment between the preamble sinusoid and the sample clock. Next, the timing loop 24 uses negative feedback to align the rising edges of the sample clock with the sinusoid peaks and to align the falling edges of the sample clock with the sinusoid zero crossings. That is, if the rising and falling edges are leading the respective peaks and zero crossings, then the loop 24 reduces the frequency of the VCO 12. Conversely, if the rising and falling edges are lagging the respective peaks and zero crossings, then the loop 24 increases the frequency of the VCO 12. Thus, the timing loop 24 provides a fine alignment between the preamble sinusoid and the sample clock. At a predetermined time $t_1$, the timing loop 24 is deemed to have aligned the sample clock with the preamble sinusoid. To maintain this alignment, however, the loop 24 continues to adjust the VCO frequency as necessary during the remainder of the preamble portion and throughout the data portion of the read signal.

Unfortunately, the timing loop 24 may generate noise that adversely affects other circuits such as those in the read path 14. Specifically, the adjusting of the VCO frequency to acquire and maintain alignment between the sample clock and the read signal often generates significant amounts of noise. Because the timing loop 24 is often integrated on the same die as noise-sensitive circuits, isolation techniques such as using ground plane or shielding are often unavailable, ineffective, prohibitively complex, or prohibitively expensive.

In addition, the timing loop 24 often has a relatively high latency, which often limits the data-read rate of the read channel 10. The loop's latency is equivalent to the loop delay, or the time it takes for a signal to travel from an arbitrary starting point in the loop, through the loop, and back to the starting point. For example, starting at the output of the read circuit 20, the phase detector 26 processes a sample of the read signal, the filtered error signal adjusts the frequency of the sample clock, in response to the phase difference between the sample point of the read signal and the sample clock, the read circuit 20 generates a subsequent sample in response to the adjusted sample clock, and then the process repeats. As the frequency of the sample clock increases, the timing loop 24 effectively responds more slowly to phase changes between the read signal and sample clock, and thus the loop's margin of stability decreases. If the frequency of the sample clock increases beyond the frequency of the loop 24, then the loop 24 oscillates and causes the read channel 10 to operate improperly. Thus, the relatively high latency of the loop 24 limits the frequency of the sample clock, and thus limits the data-read rate of the read channel 10.

Fortunately, a conventional digital timing-recovery loop does not suffer from the above-described limitations of the timing loop 24 (FIG. 1). Generally, a digital timing-recovery loop includes a free-running VCO having a frequency that corresponds to the expected rate at which the read head 18 will read data bits from the disk 16. But instead of adjusting the VCO frequency to acquire and maintain alignment between the sample clock and the read signal, the digital timing-recovery loop adjusts the values of the read samples to the values they would have had if the sample clock and read signal were aligned.

But unfortunately, using a digital timing-recovery loop instead of the phase-lock timing loop 24 (FIG. 1) often requires a reduction in the data-storage density of the disk 16 (FIG. 1). The digital timing-recovery loop lacks a start-up circuit to provide a coarse alignment between the sample clock and the read signal. Without such a start-up circuit, the digital timing-recovery loop requires a longer time to acquire alignment than the timing loop 24, and thus requires a longer preamble. Because the preamble data pattern is stored at the beginning of each sector of the disk 16, the longer the preamble, the fewer the data bits that the disk 16 can store, and thus the lower the disk's data-storage density.

SUMMARY OF THE INVENTION

In one aspect of the invention, a circuit includes a buffer for receiving and storing two samples of a signal, and a phase calculation circuit for calculating from the samples a phase difference between one of the samples and a predetermined point of the signal.

Such a circuit can be used to decrease the alignment-acquisition time of a digital timing-recovery loop, and thus allows a shortening of the preamble and a corresponding increase in the data-storage density of a disk. In one application, the circuit determines an initial phase difference between a disk-drive read signal and a read-signal sample clock. The digital timing-recovery loop uses this phase difference to provide an initial coarse alignment between the read signal and the sample clock. By providing an initial coarse alignment, the recovery loop reduces the overall alignment-acquisition time.

DESCRIPTION OF THE INVENTION

Figure 3:
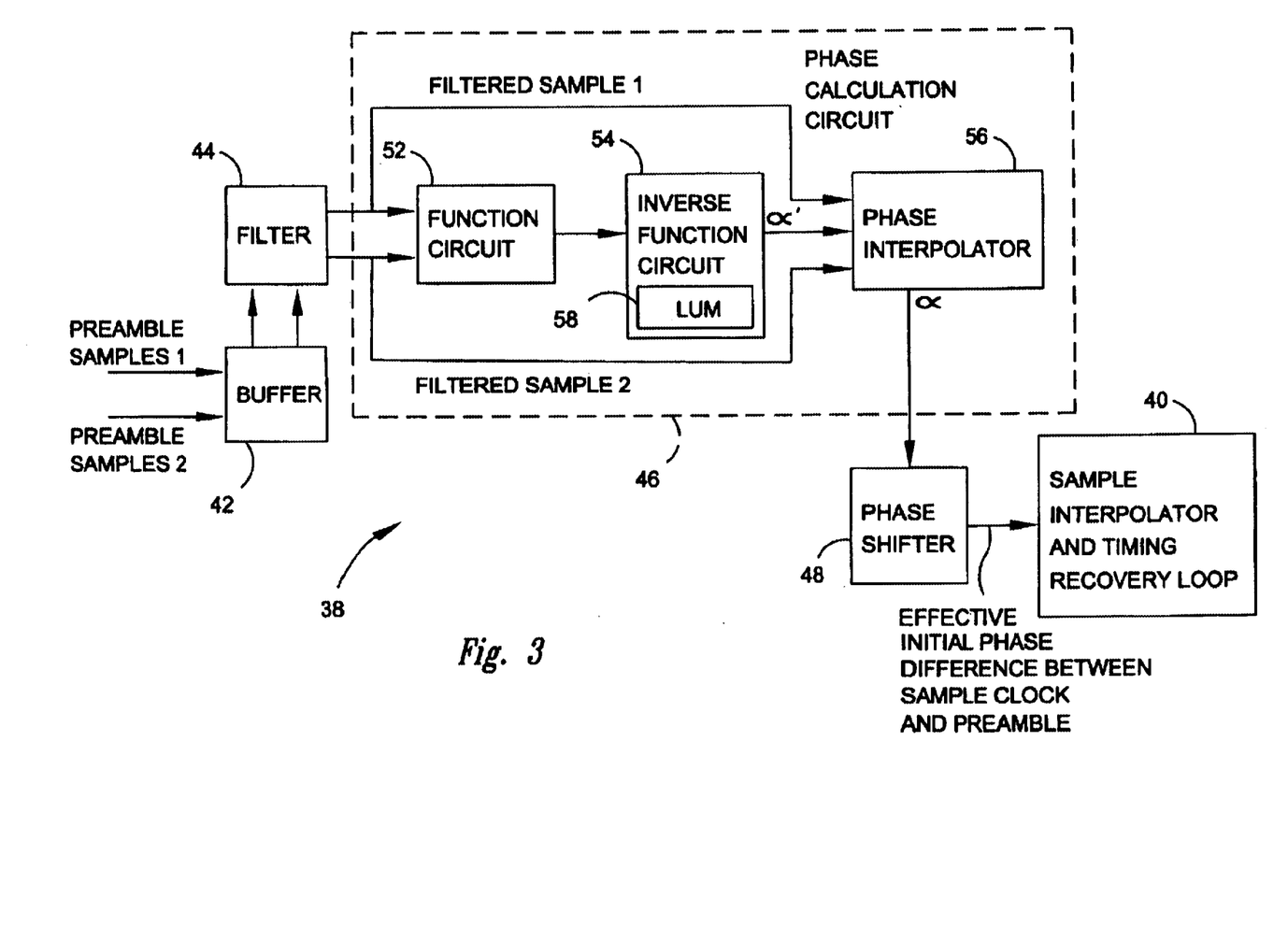
FIG. 3 is a block diagram of an initial-phase circuit according to an embodiment of the invention.

FIG. 3 is a block diagram of an initial-phase circuit 38 according to an embodiment of the invention. The circuit 38 determines an initial phase difference between a disk-drive read signal and a read-signal sample clock. A read-sample-interpolator-and-digital-timing-recovery circuit 40 uses this initial phase difference to provide an initial coarse alignment between the read signal and the sample clock. Providing this initial coarse alignment often reduces the overall read-signal/sample-clock alignment-acquisition time, and thus allows one to use a shorter preamble, which allows a corresponding increase in the data-storage density of a storage disk.

The initial-phase circuit 38 includes a conventional buffer 42 for receiving and storing read-signal samples, a conventional filter 44 for filtering the samples, a phase calculation circuit 46 for calculating the initial phase difference between the read signal and the sample clock, and a phase shifter 48 for adding an anticipated post-sampling phase shift to the initial phase difference. The circuit 38 provides this shifted initial phase difference to the circuit 40, which uses this phase difference to obtain an initial coarse alignment between the read signal and the sampling clock. Alternatively, the buffer 42, filter 44, and shifter 48 may be omitted such that the circuit 46 receives the read-signal samples directly and provides the initial phase difference directly to the circuit 40.

Still referring to FIG. 3, the circuit 38 and its sub-circuits are now discussed in more detail.

The buffer 42 receives and stores first and second raw samples of the read signal from respective sampling analog-to-digital (A/D) converters (not shown). In one embodiment, the buffer 42 receives eight first raw samples that correspond to eight respective rising edges of the sample clock (FIGS. 4–10), and receives eight second raw samples that correspond to eight respective falling edges of the sample clock. Although described as receiving the first and second raw samples from respective A/D converters, the buffer 42 may receive the first raw samples alternated with the second raw samples—first raw sample #1, second raw sample #1, first raw sample #2, second raw sample #2 . . . —from a single AND converter.

The filter 44 receives the first and second raw samples from the buffer 40 and filters the raw samples to generate a first filtered sample and a second filtered sample. In one embodiment, the filter 44 sets the first filtered sample equal to the average of the first raw samples, and sets the second filtered sample equal to the average of the second raw samples. This averaging typically eliminates most or all of the noise superimposed on the read signal.

The phase-calculation circuit 46 includes a function circuit 52 for calculating a value that represents the relative phase difference $\alpha'$, or the absolute phase difference $\alpha$ between the read signal and the sample clock, an inverse function circuit 54 for calculating $\alpha'$ or $\alpha$ from the calculated value, and an optional phase interpolator 56 for calculating $\alpha$ in embodiments where the circuits 52 and 54 calculate only $\alpha'$. In the embodiments described below, the circuit 46 calculates a equal to the absolute phase lead of a sample-clock rising edge—which in these embodiments corresponds to the first filtered sample as discussed above—with respect to the immediately succeeding peak of the preamble sinusoid.

In a first embodiment of the phase-calculation circuit 46, the function circuit 52 calculates the tangent of the absolute phase lead a equal to the ratio of the first filtered sample to the second filtered sample. The circuit 54 includes a look-up memory 58, which provides a equal to the arctangent of this ratio. Therefore, in this embodiment, the phase interpolator 56 is omitted.

In a second embodiment, the circuit 46 takes advantage of the range of the tangent magnitudes, and thus the range of the corresponding arctangent values, being the same for each quadrant of the preamble sinusoid. Specifically, the size of the look-up memory 58 is half that of the memory 58 in the first embodiment, and the arctangent value provided by the memory 58, i.e., the relative phase lead $\alpha'$, is the phase lead of the first filtered sample within the quadrant of the preamble sinusoid with which the sample coincides. The interpolator 56 identifies this quadrant by examining the polarities of the first and second filtered samples. The interpolator 56 then combines this quadrant information with $\alpha'$ to calculate $\alpha$.

In a third embodiment, the circuit 46 takes advantage of the range of the tangent magnitudes from 0 to 1, and thus the range of corresponding arctangent values, being the same for each half quadrant of the preamble sinusoid. Consequently, the look-up memory 58 need only store half a quadrant's worth of arctangent values. Thus, the size of the memory 58 is half the size of the memory 58 in the second embodiment of the circuit 46 and one quarter the size of the memory 58 in the first embodiment. Specifically, the function circuit 52 determines the ratio of the minimum of the first and second samples to the maximum of the first and second samples. This insures that the ratio, and thus the tangent of $\alpha'$, is always between 0 and 1. Consequently, the arctangent value $\alpha'$ provided by the memory 58 is the relative phase of the first filtered sample within the half quadrant of the preamble sinusoid with which the sample coincides. The interpolator 56 identifies this half quadrant by examining the polarities of the first and second filtered samples. The interpolator 56 then combines with $\alpha'$ to calculate $\alpha$.

Still referring to FIG. 3, the phase shifter 48 adds to $\alpha$ any phase shift that the read signal experiences between the sampling A/Ds (not shown) and the read-sample interpolation portion of the circuit 40. This allows the interpolation portion of the circuit 40 to accurately interpolate the values of the read signal at the data points. For example, a finite-impulse-response (FIR) filter (FIG. 16) may process the read-signal samples before the interpolation portion of the circuit 40 interpolates them. Therefore, the shifter 48 is programmed with the expected phase shift (lead or lag) that the FIR will impart to the read signal. Because the interpolation portion of the circuit 40 requires the total phase between the sample clock and read signal at the point of interpolation, the shifter 48 adjusts $\alpha$ such that $\alpha$ reflects the phase shift of the FIR filter.

The operation of the initial-phase circuit 38 is discussed below in conjunction with FIGS. 3–13, and a specific example is discussed below in conjunction with FIGS. 3, 7, 12, and 13. For example purposes, this operation is discussed where the circuit 38 incorporates the third embodiment (discussed above) of the phase-calculation circuit 46, it being understood that the circuit 38 operates in a similar manner where it incorporates the first or second embodiments of the circuit 46.

FIGS. 4–10 respectively illustrate seven possible alignments between the preamble sinusoid of the read signal and the sample clock, and thus illustrate seven possible regions of the absolute phase $\alpha$. For clarity, the preamble sinusoid is shown as noiseless such that first samples 60 and second samples 62 respectively equal the first and second filtered samples from the filter 44 (FIG. 3). More specifically, FIGS. 4–10 illustrate seven possible positions that the rising edges of the sample clock, and thus the first samples 60, can have with respect to the peaks 64 of the sinusoid. In the described embodiment, the alignment convention is that the rising edges, and thus the first samples 60, lead the immediately following peaks 64 by a phase angle $0° \leq \alpha < 180°$, where values of a are given with respect to the period of the preamble sinusoid. But other alignment conventions can be used, such as where values of a are given with respect to the sampling period, which here is one fourth the period of the preamble sinusoid. Using the described alignment convention, FIGS. 4–10 respectively show the following alignments:

$135° < 60 < 180°$, $\alpha=135°$, $90° < \alpha < 135°$, $45° < \alpha 90°$, $\alpha=45°$, $0° < \alpha < 45°$, and $\alpha=0°$.

Figure 9:
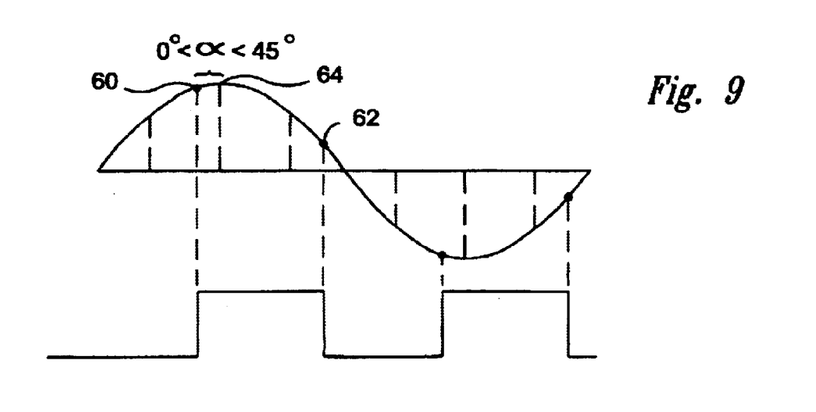
FIG. 9 is a timing diagram showing the sample clock leading the preamble sinusoid by the phase angle $0°<\alpha<45°$ according to an embodiment of the invention.
Figure 10:
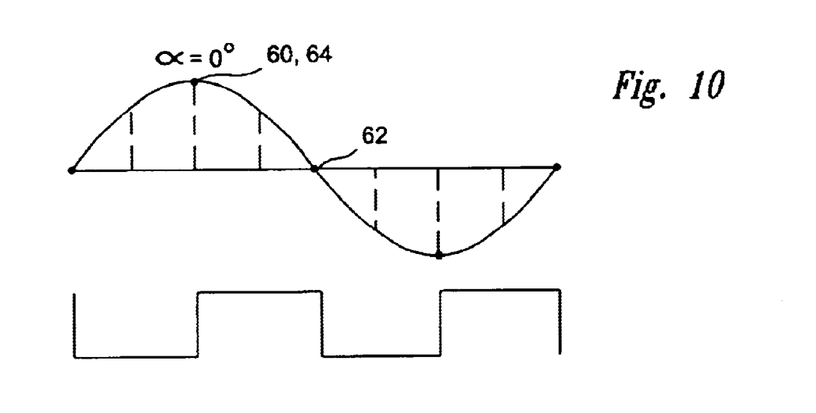
FIG. 10 is a timing diagram showing the sample clock aligned with the preamble sinusoid according to an embodiment of the invention.
Figure 11:
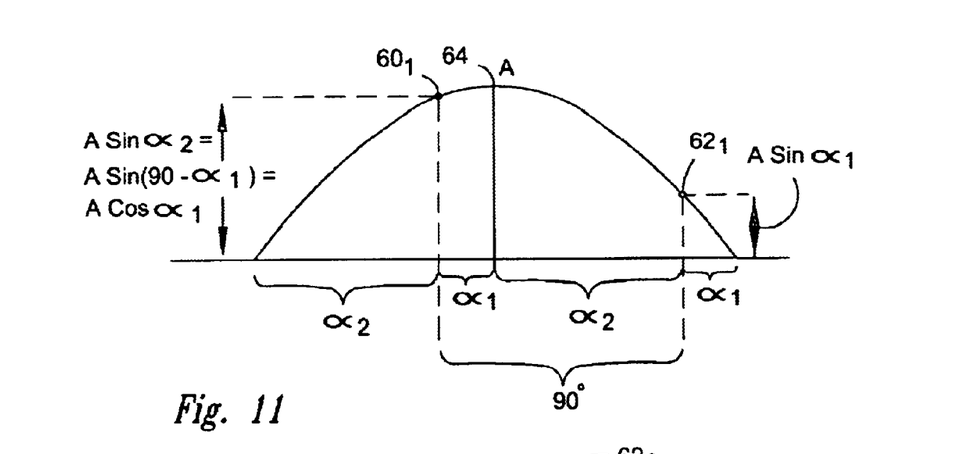
FIG. 11 is a phase diagram showing a phase angle $\alpha_1$ between the sample clock and the peak of the preamble sinusoid of FIG. 9 according to an embodiment of the invention.

FIGS. 11–12 illustrate how the phase calculation circuit 46 (FIG. 3) can use a run tangent function to obtain the phase angle between the preamble sinusoid and the sample clock. FIG. 11 is a phase diagram showing the positive half of the preamble sinusoid of FIG. 9. The first sample $60_1$, which corresponds to a rising edge of the sample clock, leads the sinusoid peak 64 by the phase angle $\alpha_1$. From well-known trigonometric identities, it is clear that $$\text{Tan } \alpha_1 = \text{Sin } \alpha_1 / \text{Cos } \alpha_1 = (\text{second sample } 62_1) \div (\text{first sample } 60_1), \quad (1)$$

and that $$\alpha_1 = \text{Arctan}\alpha_1 = \text{Arctan}[(\text{second sample } 62_1) \div (\text{first sample } 60_1)]. \quad (2)$$

Figure 7:
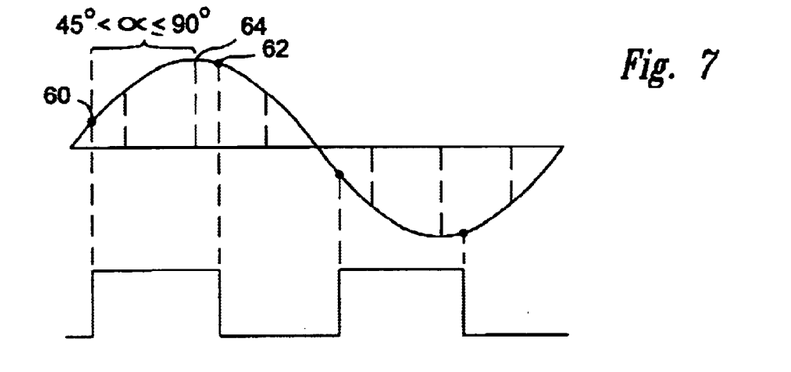
FIG. 7 is a timing diagram showing the sample clock leading the preamble sinusoid by the phase angle $45°<\alpha<90°$ according to an embodiment of the invention.
Figure 8:
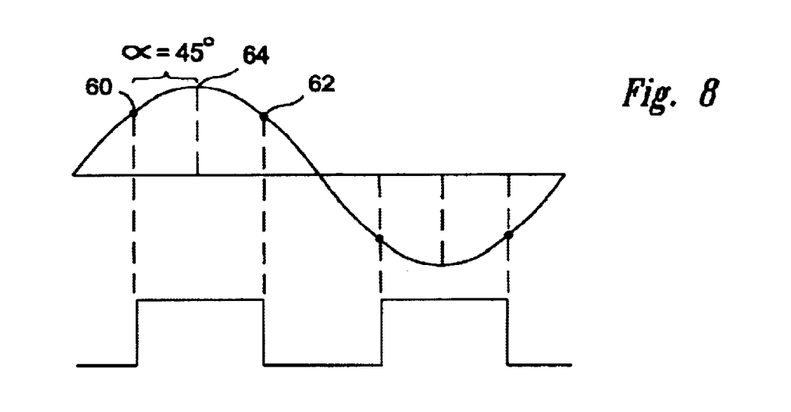
FIG. 8 is a timing diagram showing the sample clock leading the preamble sinusoid by the phase angle $\alpha=45°$ according to an embodiment of the invention.
Figure 12:
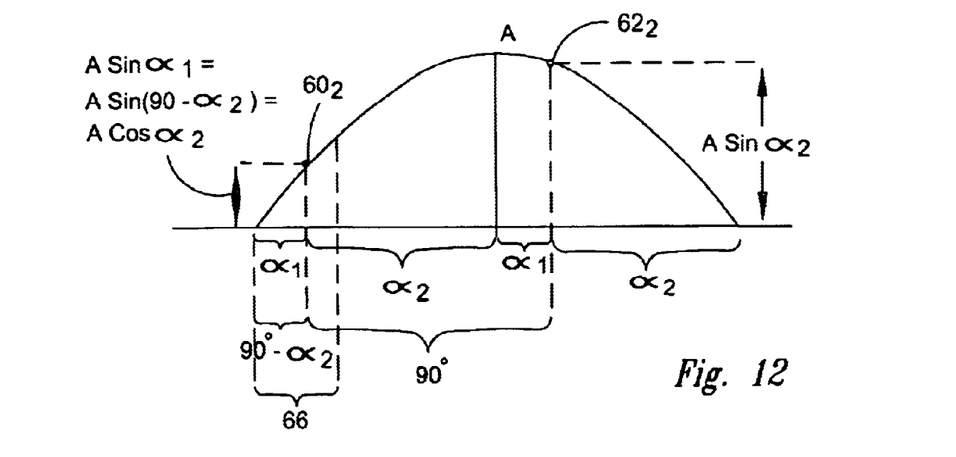
FIG. 12 is a phase diagram showing a phase angle $\alpha_2$ between the sample clock and the peak of the preamble sinusoid of FIG. 7 according to an embodiment of the invention.

Similarly, FIG. 12 is a phase diagram of the positive half of the preamble sinusoid of FIG. 7. The first sample $60_2$ leads the peak 62 by the phase angle $\alpha_2$. Therefore, it is clear that $$\text{Tan } \alpha_2 = \text{Sin } \alpha_2/\text{Cos } \alpha_2 = (\text{second sample } 62_2) \div (\text{first sample } 60_2). \quad (3)$$

But because $\alpha_2 = 90° - \alpha_1$, it follows that:

$$\text{Tan } \alpha_2 = \text{Sin}(90°-\alpha_1)/\text{Cos}(90°-\alpha_1) = \text{Cos } \alpha_1/\text{Sin } \alpha_1 = 1/\text{Tan } \alpha_1 = (\text{first sample } 60_1(\text{FIG. 11}) \div (\text{second sample } 62_2(\text{FIG. 11})), \text{ and} \quad (4)$$

$$(\text{first sample } 60_1) = (\text{second sample } 62_2) \text{ and } (\text{second sample } 62_1) = (\text{first sample } 60_2). \quad (5)$$

In more general terms, $$\text{Tan } \alpha(0°23 \alpha \leq 45°) = 1/\text{Tan}(90°-\alpha) \ (90° \geq (90°-\alpha) \geq 45°). \quad (6)$$

For example, $\text{Tan } 2° = 1/\text{Tan}(90°-2°=88°)$.

In view of equation (6) and referring to the third embodiment of the circuit 46 as described above in conjunction with FIG. 3, instead of storing values of arctan $\alpha$ over a half period (0°–180°) of the preamble sinusoid as in the above-described first embodiment or over a quadrant (0°–90°) as in the above-described second embodiment, the look-up memory 58 stores values of arctan $\alpha$ over only a half quadrant (0°–45°). This allows the look-up memory 58 to be ¼ the size needed for the first embodiment and ½ the size needed for the second embodiment. But as a consequence of this smaller memory size, the function and inverse-function circuits 52 and 54 do not provide, the entire angle $\alpha$, but only a half-quadrant component $\alpha'$ thereof. That is, $\alpha'$ is the relative phase angle of the first sample 60 within the half-quadrant of the preamble sinusoid in which the first sample lies. For example, referring to FIG. 12, $\alpha'$ indicates the location of the first sample 60 within the half quadrant 66 (45°–90°). To compensate for the memory 58 storing only a half quadrant of arctan $\alpha'$ values, the circuit 52 calculates tan $\alpha'$ according to the following equation such that tan $\alpha' \leq 1$ ($\alpha' \leq 45°$):

$$\text{Tan } \alpha' = \text{Sin } \alpha'/\text{Cos } \alpha' = \text{MIN}(\text{first sample } 60, \text{ second sample } 62) \div \text{MAX}(\text{first sample } 60, \text{ second sample } 62) \quad (7)$$

The interpolator 56 calculates $\alpha$ using $\alpha'$ and the first and second samples as discussed below.

Figure 13:
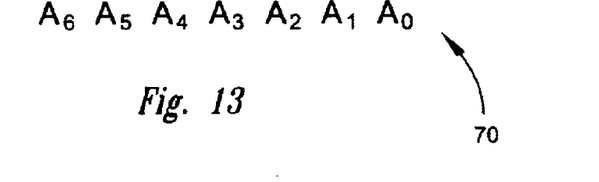
FIG. 13 is a binary representation of the phase angle $\alpha$ between the preamble sinusoid and the sample clock according to an embodiment of the invention.

FIG. 13 is a 7-bit word 70 of the phase angle $\alpha$ according to an embodiment of the invention. The bits A0–A4 are derived from arctan $\alpha'$, and thus indicate the relative phase of the first sample 60 (FIGS. 11 and 12) within a half quadrant. Therefore, the resolution of the byte 70 is $45° \div 2^5 \approx 1.41°$. A5 indicates whether $\alpha$ is greater than or less than 45°. A6 indicates whether $\alpha$ is greater than or less than 90°.

Referring to FIGS. 3, 7, 12, and 13, the operation of the third embodiment of the circuit 38 is discussed in more detail. For example purposes, assume that the first filtered sample $60_2$ leads the peak 64 of the preamble sinusoid by $\alpha_2 = 87.18°$, and thus Sin $\alpha_2 =$ second filtered sample=second sample $62_2 \approx 0.999$ and Cos $\alpha_2 =$ first filtered sample=first sample $60_2 \approx 0.049$.

First, in accordance with equation (7), because the first sample $60_2$ is less than the second sample $62_2$, the function circuit calculates Tan $\alpha'$ in accordance with the following equation:

$$\text{Tan } \alpha' = 0.049/0.999 = 0.049 \quad (8)$$

Next, the circuit 54 retrieves the corresponding value for Arctan $\alpha'$, which approximately equals 2.81°, from the look-up memory 58. The circuit 54 also converts this to a binary value according to the following equation:

$$\alpha' = B4:B0 = 2.81° \times (1 \text{ bit})/1.41° \approx 2 = 00010. \quad (9)$$

The circuit 54 then provides $\alpha' = 00010$ to the interpolator 56. In one embodiment, if the first sample equals the second sample, then the circuit 54 is programmed to set $\alpha' = 10000 = 45°$ The circuit 56 then calculates an intermediate binary value X and bit A6 according to the following equation. For clarity, the values of the first and second samples $60_2$ and $62_2$ (FIG. 12) are respectively represented by FS and SS.

$$X=1000000, A6=0 \text{ if } (FS \geq 0, SS \geq 0, |FS| \leq |SS|)$$

$$X=0, A6=0 \text{ if } (FS \geq 0, SS \geq 0, |FS| > |SS|)$$

$$X=0, A6=1 \text{ if } (FS>0, SS \leq 0, |FS| < |SS|)$$

$$X=1000000, A6=1 \text{ if } (FS>0, SS \leq 0, |FS| \geq |SS|)$$

$$X=1000000, A6=0 \text{ if } (FS \leq 0, SS<0, |FS| < |SS|)$$

$$X=0, A6=0 \text{ if } (FS \leq 0, SS<0, |FS| > |SS|)$$

$$X=0, A6=1 \text{ if } (FS<0, SS \geq 0, |FS| < |SS|)$$

$$X=1000000, A6=1 \text{ if } (FS<0, SS \geq 0, |FS| > |SS|) \quad (10)$$

In this example, because the first and second samples $60_2$ and $62_2$ are greater than zero and because the first sample is less than the second sample, then X=1000000 and A6=0.

Next, the interpolator 56 calculates A5:A0 according to the following equation:

$$A5:A0 = ((X-X6) \text{ XOR } B4:B0) + X6 \quad (11)$$

where X6 is the $6^{th}$ bit of X and XOR is a bitwise exclusive or. In this example, X–X6=0111111, (X–X6) XOR B4:B0= 0111111 XOR 0000010=0111101, and ((X–X6) XOR B4:B0)+1=0111101+1=0111110=62.

Therefore, because A6=0 here, A6:A0=0111110=62. Thus, $\alpha_2$ of FIG. 12 equals $62 \times 1.41°$/bit=87.42°, which is equivalent to $\alpha_2 = 87.18°$ assumed above taking into account the rounding errors.

Figure 4:
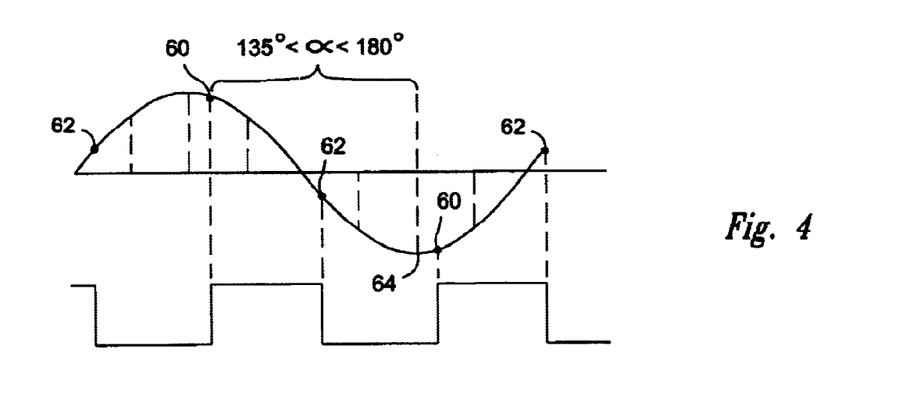
FIG. 4 is a timing diagram showing a sample clock leading a preamble sinusoid by a phase angle $135°<\alpha<180°$ according to an embodiment of the invention.
Figure 5:
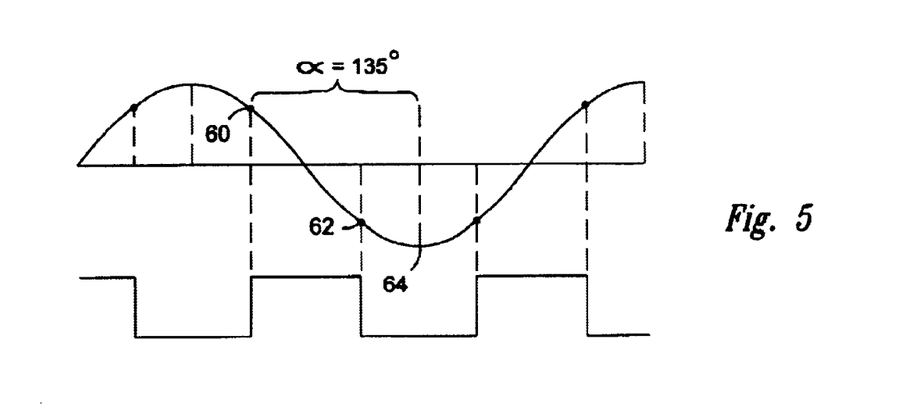
FIG. 5 is a timing diagram showing the sample clock leading the preamble sinusoid by a phase angle $\alpha=135°$ according to an embodiment of the invention.
Figure 6:
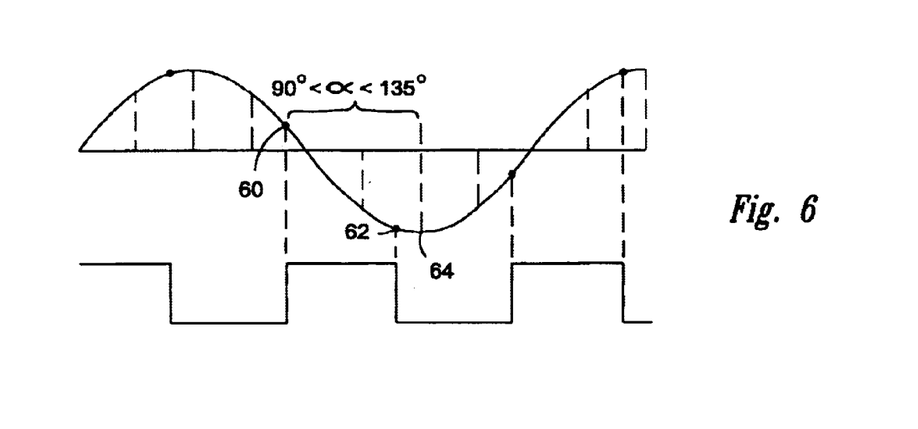
FIG. 6 is a timing diagram showing the sample clock leading the preamble sinusoid by the phase angle $90°<\alpha<135°$ according to an embodiment of the invention.

As an additional example, if A6=1 as would be the case for $\alpha$ of FIG. 4, then, still assuming that tan $\alpha \approx 0.049$ as in the previous example, A6:A0=1111110=126. Thus, $\alpha$ of FIG. 4 equals $126 \times 1.41°$/bit=177.66°, which us equivalent to $90° + 87.42° = 177.42°$ taking into account rounding errors.

Next, referring again to FIG. 3, the shifter 48 adds any post-sampling phase shift to $\alpha$ to obtain the total phase shift between the sample clock and the preamble sinusoid as seen by the sample interpolator portion of the circuit 40. For example, an FIR filter (FIG. 16) in the read path may add to or subtract from the phase lead $\alpha$ generated by the initial-phase circuit 46. Because this post-sampling phase shift may cause A6:A0 to "wrap around", A6:A0 is altered as described below. Here, wrap around refers to the post-sampling phase shift causing a to cross a 90° boundary. That is, if $\alpha < 90°$, the post-sampling phase shift wraps around the total phase lead $\alpha$ to greater than 90°, and if $\alpha > 90°$, the post-sampling phase shift wraps around a to less than 90°.

Referring to FIGS. 3, 6, 7, and 12, the operation of the phase shifter 48 is discussed by way of example. Assume that A6:A0=0111110=62 and $\alpha_2$ of FIG. 12 equals 87.42° as discussed in the example above. Furthermore, assume that the post-sampling phase shift adds approximately 5.64° to $\alpha_2$ for a total phase shift of approximately 93.06°. Converting the post-sampling phase shift to binary gives 5.64°×bit/

1.41°×4=100. Adding this phase shift to A6:A0=0111110+ 0000100=1000010. 1000010×1.41°/bit=Total Phase Lead 93.06°.

Although this example works cleanly where α is given in terms of the preamble-sinusoid period, merely adding the post-sampling phase shift to α where α is given in terms of the sampling period may give an improper answer, particularly where A6 and A5:A0 are stored in different registers. Therefore, in this situation, the shifter 48 (FIG. 3) calculates the Total Phase Lead in the following manner.

Specifically, in terms of the preamble sinusoid, the sampling period (the time between the first and second samples, i.e., the time between a consecutive rising and falling edge of the sample clock) is 90°. But in terms of the sampling period, the sampling period is 360°. Therefore, A5:A0 represents $0° \leq \alpha \leq 360°$ in terms of the sampling period. Thus, if A5:A0 overflows, the Total Phase Lead=360°+α in terms of the sampling period. This "wrap around" is accounted for as described below.

First, the shifter 48 adds the post-sampling phase shift to α as described above to generate an Intermediate Phase Lead (IPL). But all the degree values used above are multiplied by four to be in terms of the sampling period. Therefore, the post-sampling phase shift equals (5.64°×4=22.56°)×bit/ (1.41°×4=5.64°)=4=100. Adding this phase shift to A5:A0= 0111110+1000100=1000010=IPL, where the most significant bit of the IPL is the overflow bit. Thus, A5:A0 alone indicates a Total Phase Lead of 11.28°, but we know that the correct Total Phase Lead has wrapped around to 4×87.42°= 349.68°+22.56°=372.24° because the overflow bit (the most significant bit of the IPL) is 1. Therefore, to account for the wrap around, the shifter 48 generates a value Wrap according to the following equation:

Wrap=(most significant bit of the IPL) AND 1      (12)

Here, the most significant bit of the IPL equals 1, so Wrap=1. Next, the shifter 48 recalculates A6 according to the following equation:

A6=(A6 from equation (10)) XOR Wrap      (13)

Here, the newly calculated A6=0 XOR 1=1. This flipping of A6 from 0 to 1 indicates the wrap around. Then, the circuit 48 modifies the IPL according to the following equation, where post-sampling phase shift is abbreviated psps:

IPL=IPL+64 if psps<0, Wrap=1

IPL=IPL−64 if psps≧0, Wrap=1

IPL=IPL if Wrap=0      (14)

Here, because Wrap=1 and psps=22.56°≧0, IPL=IPL−64= 1000010−1000000=0000010, and A5:A0=000010. Because A6=1, then A6:A0 as modified by the shifter 48=10000010= 66, and the Total Phase Lead=66×5.64°=372.24°, which is the correct answer in terms of the sample period. Looking at it another way, the total phase lead is A6=360°+A5:A0= 11.28°=371.28°, which is equivalent to 372.24° taking into account the rounding errors.

Figure 14:
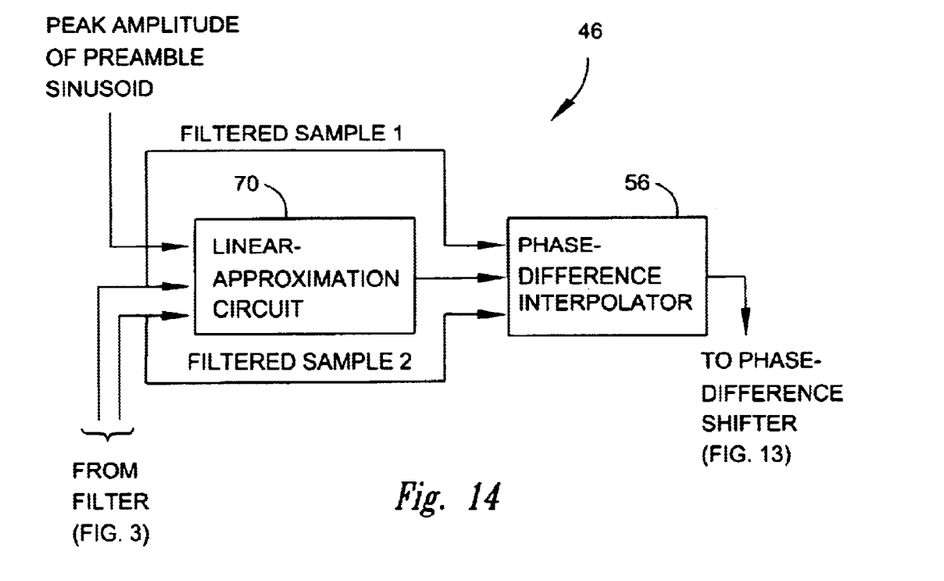
FIG. 14 is a block diagram of a linear-approximation version of the phase-difference calculation circuit of FIG. 3 according to an embodiment of the invention.

FIG. 14 is a block diagram of a fourth embodiment of the phase-calculation circuit 46 of FIG. 3. This embodiment generates the relative half-quadrant phase α' by approximating a portion of the preamble sinusoid as linear and then successively approximating α'. Unlike the first, second, and third embodiments of the circuit 46 discussed above, this embodiment needs more time to calculate α' and depends on the sampled peak amplitude of the preamble sinusoid. But it does not require the look-up memory 58 (FIG. 3), and thus occupies less die layout area than the first, second, and third embodiments.

The fourth embodiment of the circuit 46 includes a linear-approximation circuit 70, which replaces the function and inverse function circuits 52 and 54 of FIG. 3, and includes the phase-interpolator 56. The circuit 70 calculates α' from the first and second filtered samples and from the sampled peak amplitude of the preamble sinusoid. A circuit for calculating and providing the sampled peak amplitude is discussed in U.S. Patent App. entitled "A Circuit And Method For Controlling The Gain Of An Amplifier Based On The Sum Of Samples Of The Amplified Signal", patent application Ser. No. 09/503,949, which has the same filing date as the present application, and U.S. Patent App. entitled "A Circuit And Method For Controlling The Gain Of An Amplifier", patent application Ser. No. 09/503,399, which has the same filing date as the present application and incorporated by reference.

Figure 15:
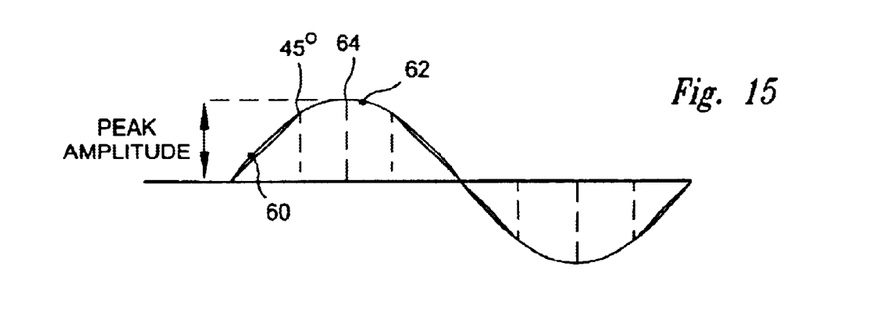
FIG. 15 is a diagram showing a linear approximation of portions of the preamble sinusoid according to an embodiment of the invention.

Referring to FIG. 15, the operational theory of the circuit 46 of FIG. 14 is discussed. FIG. 15 shows the preamble sinusoid of FIG. 7 superimposed on linear approximations of the following half-quadrants of the preamble sinusoid: 0°–45°, 135°–225°, and 315°–360°. These half-quadrants are chosen because they are more linear than the other half-quadrants of the preamble sinusoid. By linearizing these half-quadrants, the circuit 46 can calculate α' within a half quadrant as proportional to the sample lying within that half quadrant as discussed below. Referring to FIGS. 14 and 15, the operation of the circuit 46 is discussed by way of example. For example purposes, assume that the phase lead α of the first sample 60 is 87.18° with respect to the peak 64, the first sample 60=0.049, the peak amplitude=1, and α' has a resolution of 5 bits B4:B0. Because the phase of the linearly approximated half quadrant ranges from 0°–45°, the amplitude ranges from 0–sin 45°×(peak amplitude)=0 –0.707. Therefore, a 1 for B4 represents the linear halfway point between 0 and 0.707, or 0.353. Likewise, a 1 for B3 represents 0.176, which is the linear halfway point between 0 and 0.353, a 1 for B2 represents 0.088, which is the linear halfway point between 0 and 0.176, a 1 for B1 represents 0.044, which is the linear halfway point between 0 and 0.088, and a 1 for B0 represents 0.022, which is the linear halfway point between 0 and 0.044. The linear-approximation circuit 70 uses these values to successively approximate α' in five steps, one step for each bit B4:B0.

First, the linear-approximation circuit 70 determines which of the first and second filtered samples lies within one of the linearly approximated half quadrants. Therefore, in this example, the circuit 70 determines that the first sample 60 lies within such a half quadrant.

Next, the circuit 70 uses the first sample 60 to successively approximate α'. First, the circuit 70 compares the sample to 0.353 to generate B4. Here, 0.049 is less than 0.353, so the circuit 70 generates B4=0. Then, the circuit 70 compares the sample to 0.176 to generate B3. Here, 0.049 is less than 0.176, so the circuit 70 generates B3=0. Next, the circuit 70 compares the sample to 0.088 to generate B2. Here, 0.049 is less than 0.088, so the circuit generates B2=0. Then, the circuit 70 compares the sample to 0.044 to generate B1. Here, 0.049 is greater than 0.044, so the circuit generates B1=1. Next, the circuit 70 compares the sample to 0.022+0.044=0.066, which is the linear halfway point between 0.044 and 0.088, to generate B0. Here, 0.049 is less than 0.066, so the circuit generates B0=0. Thus, B4:B0= 00010, which is the same as calculated by the inverse-function circuit 54 of FIG. 3 in the above example for the same value, 0.049, of the first sample. The interpolator 56 then calculates α from B4:B0 and the values of the first and second samples 60 and 62 in the manner described above in conjunction with FIGS. 3–13.

Figure 16:
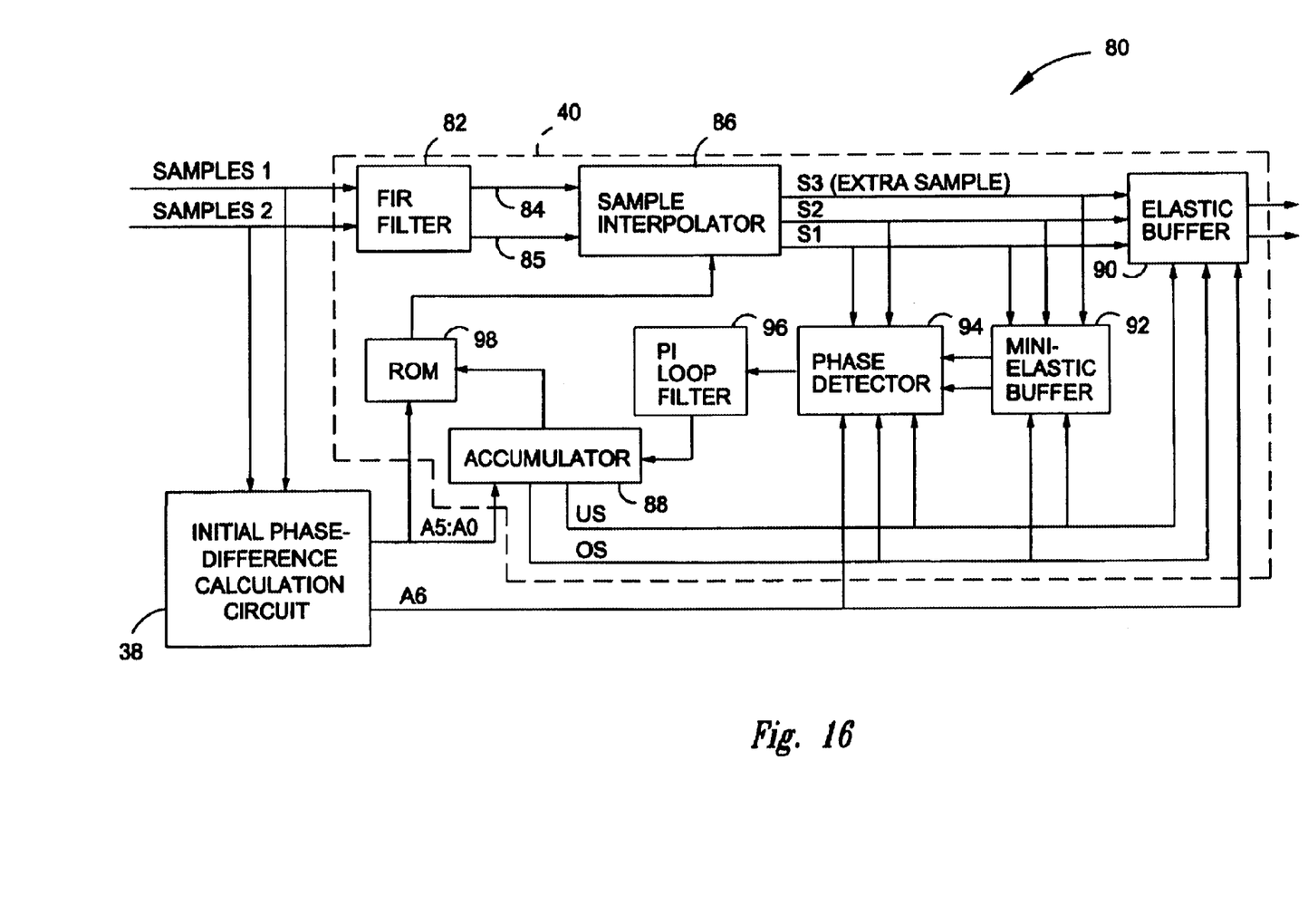
FIG. 16 is a block diagram of a read channel that includes the initial-phase circuit of FIG. 3 according to an embodiment of the invention.

FIG. 16 is a block diagram of a digital-baud-rate-timing-recovery circuit 80 according to an embodiment of the invention. The circuit 80 incorporates the initial-phase circuit 38 and the sample interpolator and timing recovery loop 40 of FIG. 3. The circuit 38 may include any of the embodiments of the phase-calculation circuit 46 of FIGS. 3 and 14. Although details of the circuit 80 are discussed below, further details are disclosed in U.S. patent application Ser. No. 09/387,146, "Digital Timing Recovery Using Baud Rate Sampling", filed Aug. 31, 1999 and incorporated by reference.

Still referring to FIG. 16, the first and second samples are input to an finite-impulse-response (FIR) filter 82, which equalizes each sample to its nearest expected signal level, and then provides the equalized first and second samples on data paths 84 and 85, respectively. A sample interpolator 86 operates on the incoming equalized samples and provides interpolated samples calculated at an interpolation interval provided by an accumulator 88. The sample interpolator 86 has three output paths. Two of the output paths provide the two interpolated samples S1 and S2, which are derived in parallel by the interpolator 86. The third output path provides an un-interpolated sample S3 as may be necessary in an under-sampling condition. The interpolator 86 provides all three samples S1, S2, and S3 to an elastic buffer 90 and to a mini-elastic buffer 92, which provides the correct stream of data to a phase detector 94 (described below). Note that because of the parallel sampling paths throughout the system, the interpolator 86 outputs two interpolated samples S1 and S2 during each cycle of normal operation. During an oversample condition, the interpolator 86 provides one valid interpolated sample and one bogus interpolated sample. In an undersample condition, the interpolator 86 outputs three samples: the interpolated sample S1, the interpolated sample S2, and the uninterpolated sample S3, which is provided by the interpolator 86 to compensate for the fact that the interpolator 86 cannot interpolate two samples in one (half-rate) cycle.

The interpolator 86 also provides the interpolated samples S1 and S2 to the phase detector 94, which determines the phase difference between the interpolated samples S1 and S2 and the expected values of the samples S1 and S2, and which generates a corresponding phase-error signal. The phase detector 94 provides this phase-error signal to a proportional-integral filter 96, which provides the filtered error signal to the accumulator 88. The accumulator 88 derives the fractional delay, also known as the interpolation value tau ($\tau$), from the filtered error signal.

The interpolation value $\tau$ is used to select a set of coefficients employed by the sample interpolator 86 to derive the interpolation samples S1 and S2. These coefficient values are stored in a read only memory (ROM) 98, which receives the $\tau$ value from the accumulator 88 and provides to the sample interpolator 86 the appropriate coefficient values corresponding to the desired interpolation interval.

Figure 17:
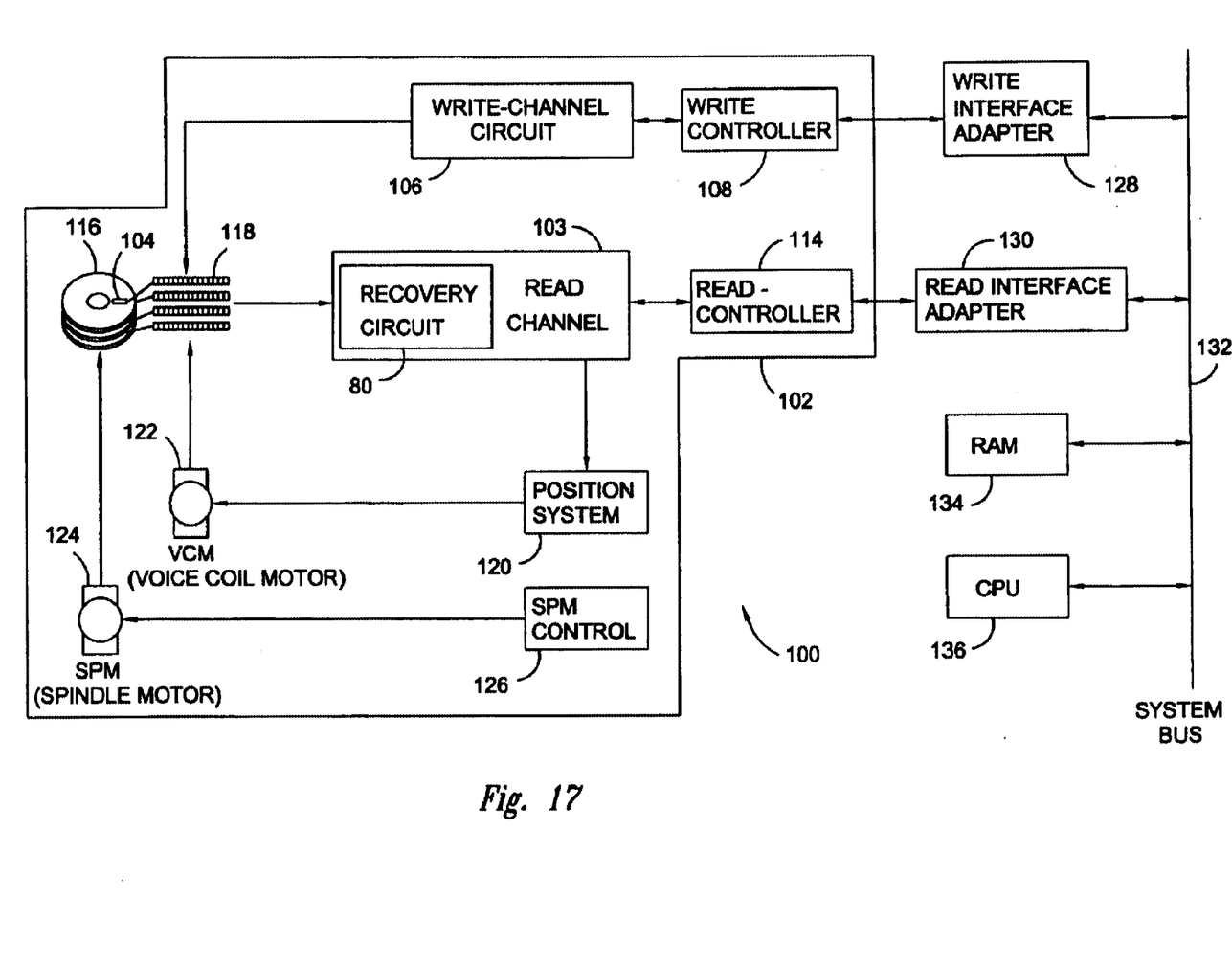
FIG. 17 is a block diagram of a disk-drive system that includes the read channel of FIG. 16 according to an embodiment of the invention.

As discussed above, the initial phase circuit 38 calculates a gain-independent initial phase α representing the phase lead of the sample clock with respect to the preamble sinusoid. The circuit 38 provides the bits A5:A0 of α to the accumulator 88 and to the ROM 98. This portion of α is used to select the initial value that is input to the sample interpolator 86 at the start of a read cycle. Furthermore, the circuit 38 provides the bit A6 of α to the elastic buffer 90 and to the phase detector 94. FIG. 17 is a block diagram of a disk-drive system 100, which includes a disk drive 102, according to an embodiment of the invention. The disk drive 102 includes a read channel 103, which incorporates the recovery circuit 80 of FIG. 16. The disk drive 102 includes a combination write/read head 104, a write-channel circuit 106 for generating and driving the head 104 with a write signal, and a write controller 108 for interfacing the write data to the write-channel circuit 106. The disk drive 102 also includes the read channel 103 for receiving a read signal from the head 104 and for recovering data from the read signal, and includes a read controller 114 for organizing the read data. The disk drive 102 further includes a storage medium such as one or more disks 116, each of which may store data on one or both sides. The read/write head 104 writes/reads the data stored on the disks 116 and is connected to a movable support arm 118. A position system 120 provides a control signal to a voice-coil motor (VCM) 122, which positionally maintains/moves the arm 118 so as to positionally maintain/radially move the head 104 over the desired data on the respective disks 116. A spindle motor (SPM) 124 and a SPM control circuit 126 respectively rotate the disks 116 and maintain them at the proper rotational speed.

The disk-drive system 100 also includes write and read interface adapters 128 and 130 for respectively interfacing the write and read controllers 108 and 114 to a system bus 132, which is specific to the system used. Typical system busses include ISA, PCI, S-Bus, Nu-Bus, etc. The system 10 also typically has other devices, such as a random access memory (RAM) 134 and a central processing unit (CPU) 136 coupled to the bus 132.

From the foregoing it will be appreciated that, although specific embodiments of the invention have been described herein for purposes of illustration, various modifications may be made without deviating from the spirit and scope of the invention. For example, although the circuits of FIGS. 3, 14, 16, and 17 are described as having distinct circuit blocks, the functions of some or all of these blocks may be performed by one or more processors. Furthermore, because one of skill in the art can design circuitry or software to perform the above-described functions, the details of this circuitry and software are omitted for clarity.

What is claimed:

1. A data read channel, comprising:
   a sampler operable to receive a sample clock having a sample frequency and, in response to the sample clock, sample a read signal at first and second preamble times during a preamble portion and at a first data time during a data portion having a data rate, and operable to generate corresponding first and second preamble-sample values and a corresponding data-sample value;
   a sample interpolator coupled to the sampler, operable to receive a phase difference between the first data time and a second data time that corresponds to a data window of the read signal, and operable to generate from the data-sample value and the phase difference an adjusted sample value that equals or approximately equals the value of the read signal at the second time;
   a timing-recovery circuit coupled to the sample interpolator and operable to track and update the phase difference when the sample frequency is lower than or equal to the data rate; and
   an initial-phase circuit coupled to the sampler and the timing-recovery circuit and operable to calculate an initial value of the phase difference as a trigonometric function of the first and second preamble values.

2. The data read channel of claim 1, further comprising a filter coupled to the sampler and to the initial-phase circuit and operable to receive the first and second preamble values from the sampler, filter the samples, and provide the filtered samples to the initial-phase circuit.

3. The data read channel of claim 1, further comprising a phase shifter coupled to the initial-phase circuit and operable to shift the calculated initial value of the phase difference by an amount equal or approximately equal to a post-sampling phase shift applied to the read signal.

4. A data read channel, comprising:
a sampler operable to receive a sample clock having a sample frequency and, in response to the sample clock, sample a read signal at first and second preamble times during a preamble portion and at a first data time during a data portion having a data rate, and operable to generate corresponding first and second preamble-sample values and a corresponding data-sample value;
a sample interpolator coupled to the sampler, operable to receive a phase difference between the first data time and a second data time that corresponds to a data window of the read signal, and operable to generate from the data-sample value and the phase difference an adjusted sample value that equals or approximately equals the value of the read signal at the second time;
a timing-recovery circuit coupled to the sample interpolator and operable to track and update the phase difference when the sample frequency is lower than or equal to the data rate;
a function circuit coupled to the sampler and operable to calculate from the preamble-sample values a trigonometric value of a phase difference between one of the samples and a predetermined point of the preamble portion of the read signal; and
an inverse-function circuit coupled to the timing-recovery circuit and to the function circuit and operable to calculate from the trigonometric value an initial value of the phase difference between the first and second data times.

5. The circuit of claim 4 wherein:
the trigonometric value comprises a tangent value; and
the function circuit is operable to calculate the tangent value equal to the quotient of the two preamble sample values.

6. The circuit of claim 4 wherein:
the trigonometric value comprises a tangent value;
one of the preamble sample values is smaller than the other preamble sample value; and
the function circuit is operable to calculate the tangent value equal to the smaller sample value divided by the other sample value.

7. The circuit of claim 4 wherein:
the trigonometric value comprises a tangent value;
the function circuit is operable to calculate the tangent value equal to the quotient of the two preamble sample values; and
the inverse-function circuit is operable to calculate the initial value of the phase difference equal to the arctangent of the tangent value.

8. The circuit of claim 4 wherein:
the trigonometric value comprises a tangent value;
one of the sample values is smaller than the other sample value;
the function circuit is operable to calculate the tangent value equal to the smaller sample value divided by the other sample value; and
the inverse-function circuit is operable to calculate the initial value of the phase difference equal to the arctangent of the tangent value.

9. A data read channel, comprising:
a sample interpolator operable to receive a sample of a data portion of a read signal and a phase difference between the sample and a desired sampling time, and operable to generate from the sample and the phase difference an adjusted sample that substantially equals the value of the data portion of the read signal at the desired sampling time;
a timing-recovery circuit coupled to the sample interpolator and operable to track and update the phase difference when the sampling rate of the data portion of the read signal is lower than or equal to the data rate of the data portion;
a filter operable to generate first and second filtered samples of a preamble portion of the read signal before the sample interpolator receives the sample of the read signal;
a function circuit coupled to the filter and operable to calculate a trigonometric value corresponding to the location of one of the filtered samples with respect to a predetermined point of the read signal, the trigonometric value being equal to a ratio of the filtered samples;
an inverse-function circuit coupled to the function circuit and operable to calculate a component of the filtered-sample location from the trigonometric value; and
a phase interpolator coupled to the timing-recovery circuit, the inverse-function circuit, and the filter and operable to determine from the component and the filtered samples a phase between the sample location and the predetermined point of the read signal and to provide this phase to the timing-recovery circuit as an initial value of the phase difference.

10. The data read channel of claim 9 wherein the filter is operable to:
generate the first filtered sample equal to an average of first samples of the preamble portion of the read signal that are spaced apart from each other by or approximately by half a period of the preamble portion; and
generate the second filtered sample equal to an average of second samples of the preamble portion of the read signal that are spaced apart from each other by or approximately by half a period of the preamble portion and that are respectively spaced apart from the first samples by or approximately by a quarter period of the preamble portion.

11. A circuit, comprising:
a filter operable to generate first and second filtered samples of a periodic signal;
a function circuit coupled to the filter and operable to calculate a trigonometric value corresponding to the location of one of the filtered samples with respect to a predetermined point of the signal, the trigonometric value being equal to a ratio of the filtered samples;
an inverse-function circuit coupled to the function circuit and operable to calculate a component of the sample location from the trigonometric value;
an interpolator coupled to the inverse-function circuit and the filter and operable to determine the sample location from the component and the filtered samples;
wherein if the absolute value of one of the filtered samples is larger than the absolute value of the other filtered sample, then the function circuit is operable to calculate the trigonometric value equal to the tangent of the smaller absolute value divided by the larger absolute value; and wherein if the absolute values of the filtered samples are equal, then the function circuit is operable to calculate the trigonometric value equal to the tangent of 45°.

12. The circuit of claim 9 wherein:

the inverse-function circuit comprises a memory operable to store values of the component of the filtered-sample location; and wherein the inverse-function circuit is operable to calculate the component of the filtered-sample location equal to a stored value that corresponds to the trigonometric value.

13. The circuit of claim 9 wherein:

the inverse-function circuit is operable to calculate the component of the filtered-sample location equal to or approximately equal to the location of the filtered sample within a half quadrant of the preamble portion of the signal; and the interpolator is operable to calculate the location of the half quadrant of the preamble portion of the read signal within which the filtered sample lies.

14. A circuit, comprising:

a filter operable to generate first and second filtered samples of a periodic signal;

a function circuit coupled to the filter and operable to calculate a trigonometric value corresponding to the location of one of the filtered samples with respect to a predetermined point of the signal, the trigonometric value being equal to a ratio of the filtered samples;

an inverse-function circuit coupled to the function circuit and operable to calculate a component of the sample location from the trigonometric value;

an interpolator coupled to the inverse-function circuit and the filter and operable to determine the sample location from the component and the filtered samples;

wherein the periodic signal comprises a sinusoid;

wherein the predetermined point of the signal comprises a peak of the sinusoid;

wherein the sample location comprises the location of the first filtered sample and leads the predetermined point;

wherein the inverse-function circuit is operable to calculate the component of the sample location equal to the phase difference between the sample location and a boundary of a half quadrant of the periodic signal within which the sample lies; and wherein the interpolator is operable to calculate the phase difference between the sample location and the predetermined point equal to, 90° minus the component of the sample location if the first and second filtered samples have the same polarities and the absolute value of the first filtered sample is less than the absolute value of the second filtered sample, 45° if the first filtered sample equals the second filtered sample, the component of the sample location if the first and second filtered samples have the same polarities and the absolute value of the first filtered sample is greater than the absolute value of the second filtered sample, 180° minus the component of the sample location if the first and second filtered samples have opposite polarities and the absolute value of the first filtered sample is greater than the absolute value of the second filtered sample, 135° if the first and the second filtered samples have opposite polarities and the same absolute values, and 90° plus the component of the sample location if the first and second filtered samples have opposite signs and the absolute value of the first filtered sample is less than the absolute value of the second filtered sample.

15. A data read channel, comprising:

a sampler operable to receive a sample clock having a sample frequency and, in response to the sample clock, sample a read signal at first and second preamble times during a preamble portion and at a first data time during a data portion having a data rate, and operable to generate corresponding preamble-sample values and a corresponding data-sample value;

a sample interpolator coupled to the sampler, operable to receive a phase difference between the first data time and a second data time that corresponds to a data window of the read signal, and operable to generate from the data-sample value and the phase difference an adjusted sample value that equals or approximately equals the value of the read signal at the second time;

a tracking circuit coupled to the sample interpolator and operable to track and update the phase difference when the sample frequency is lower than or equal to the data rate; and an initial-phase circuit coupled to the sampler, sample interpolator, and tracking circuit and operable to calculate a quotient of the first and second preamble values and to calculate an initial value of the phase difference as a trigonometric function of the quotient.

16. The data read circuit of claim 15 wherein:

the data window has a center; and the second data time corresponds to the center of the data window.

17. A disk-drive system, comprising:

a data-storage disk having a surface and operable to store a preamble and data values;

a motor coupled to and operable to rotate the disk;

a read head operable to generate a read signal that includes the preamble followed by a data portion that includes the data values at a data rate, each of the data values located within a respective data window of the read signal, each of the data windows having a center;

a read-head positioning assembly operable to move the read head over the surface of the disk; and a read channel, comprising a sampler operable to receive a sample clock having a sample frequency and, in response to the sample clock, sample the preamble of the read signal at first and second preamble times and the data portion at a first data time and to generate corresponding preamble-sample values and a corresponding data-sample value, a sample interpolator coupled to the sampler, operable to receive a phase difference between the first data time and a second data time corresponding to the center of a data window, and operable to generate from the data-sample value and the phase difference an adjusted sample value that equals or approximately equals the value of the read signal at the center of the data window, a tracking circuit coupled to the sample interpolator and operable to track and update the phase difference when the sample frequency is lower than or equal to the data rate, and an initial-phase circuit coupled to the sampler, sample interpolator, and tracking circuit and operable to calculate an initial value of the phase difference as a trigonometric function of the first and second preamble values.

18. A method, comprising:

generating two samples of a preamble signal;

determining as a trigonometric function of the samples an initial phase difference equal to a phase difference between one of the samples and a predetermined point of the preamble signal;

sampling at a sampling rate a data signal having a data rate;

generating from the initial phase difference a phase difference between a sample of the data signal and a predetermined point of the data signal when the sampling rate is lower than or equal to the data rate; and adjusting the sample of the data signal in response to the phase difference between the sample and the predetermined point of the data signal.

19. The method of claim 18, further comprising filtering noise from the samples of the preamble signal before determining the initial phase difference.

20. The method of claim 18, further comprising shifting the initial phase difference by an amount equal or approximately equal to a predetermined post-sampling phase shift experienced by the preamble signal.

21. A method, comprising:

generating two samples of a sinusoidal preamble signal;

determining from the samples a trigonometric value of a first phase difference between one of the samples and a predetermined point of the preamble signal;

calculating the first phase difference from the trigonometric value;

sampling at a sampling rate a data signal that has a data rate and that follows the preamble signal;

generating from the first phase difference a second phase difference between a sample of the data signal and a predetermined point of the data signal when the sampling rate is lower than or equal to the data rate; and adjusting the sample of the data signal in response to the second phase difference between the sample and the predetermined point of the data signal.

22. The method of claim 21 wherein:

the trigonometric value comprises a tangent value; and the determining comprises setting the tangent value equal to a quotient of the two samples of the preamble signal.

23. The method of claim 21 wherein:

the trigonometric value comprises a tangent value; and the determining comprises setting the tangent value equal to a quotient of the two samples of the preamble signal, the quotient being less than or equal to 1.

24. The method of claim 21 wherein:

the trigonometric value comprises a tangent value;

the determining comprises setting the tangent value equal to the quotient of the two samples of the preamble signal; and the calculating comprises setting the first phase difference equal to the arctangent of the tangent value.

25. The method of claim 21 wherein:

the trigonometric value comprises a tangent value;

the determining comprises setting the tangent value equal to the quotient of the two samples of the preamble signal, the quotient being less than or equal to one; and the calculating comprises setting the first phase difference equal to the arctangent of the tangent value.

26. A method, comprising:

generating first and second samples of a periodic signal;

calculating a trigonometric value corresponding to the location of one of the samples with respect to a predetermined point of the signal, the trigonometric value being equal to a ratio of the samples;

calculating a relative phase of the sample location from the trigonometric value;

determining the sample location from the relative phase and the samples;

sampling at a sampling rate a data signal that follows the Periodic signal and that has a data rate;

generating from the sample location a phase difference between a sample of the data signal and a predetermined point of the data signal when the sampling rate is lower than or equal to the data rate; and adjusting the sample of the data signal in response to the phase difference between the sample and the predetermined point of the data signal.

27. The method of claim 26 wherein the generating comprises:

generating first raw samples that are spaced apart from each other by or approximately by half a period of the periodic signal;

averaging the first raw samples to generate the first sample;

generating second raw samples that are spaced apart from each other by or approximately by half a period of the periodic signal and that are respectively spaced apart from the first raw samples by or approximately by a quarter period of the periodic signal; and averaging the second raw samples to generate the second sample.

28. A method, comprising:

generating first and second samples of a periodic signal;

calculating a trigonometric value corresponding to the location of one of the samples with respect to a predetermined point of the signal, the trigonometric value being equal to a ratio of the samples;

calculating a relative phase of the sample location from the trigonometric value; and determining the sample location from the relative phase and the samples;

wherein the calculating the trigonometric value comprises,
if the absolute value of one of the samples is larger than the absolute value of the other sample, then setting the trigonometric value equal to the tangent of the quotient of the smaller absolute value to the larger absolute value; and
if the absolute values of the samples are equal, then setting the trigonometric value equal to one.

29. The method of claim 26 wherein the calculating the relative phase comprises retrieving from a look-up table the relative phase of the sample location that corresponds to the trigonometric value.

30. The method of claim 26 wherein:

the calculating the relative phase comprises calculating a fine position of the sample location; and the determining comprises determining a coarse position of the sample location.

31. A method, comprising:

generating first and second samples of a periodic signal;

calculating a trigonometric value corresponding to the location of one of the samples with respect to a predetermined point of the signal, the trigonometric value being equal to a ratio of the samples;

calculating a relative phase of the sample location from the trigonometric value; and determining the sample location from the relative phase and the samples;

wherein the periodic signal comprises a sinusoid;

wherein the predetermined point of the signal comprises a peak of the sinusoid;

wherein the sample location comprises the location of the first sample;

wherein the first sample leads the predetermined point;

wherein the calculating the relative phase comprises setting the relative phase of the sample location equal to the phase difference between the sample location and a boundary of a half quadrant of the periodic signal within which the sample-lies; and wherein the determining comprises setting the phase difference between the sample location and the predetermined point equal to, 90° minus the relative phase of the sample location if the first and second samples have the same polarities and the absolute value of the first sample is less than the absolute value of the second sample, 45° if the first sample equals the second sample, the relative phase of the sample location if the first and second samples have the same polarities and the absolute value of the first sample is greater than the absolute value of the second sample, 180° minus the relative phase of the sample location if the first and second samples have opposite polarities and the absolute value of the first sample is greater than the absolute value of the second sample, 135° if the first and the second samples have opposite polarities and equal absolute values, and 90° plus the relative phase of the sample location if the first and second samples have opposite signs and the absolute value of the first sample is less than the absolute value of the second sample.

* * * * *